United States Patent [19]
Ståhl et al.

[11] Patent Number: 6,161,612
[45] Date of Patent: Dec. 19, 2000

[54] COOLING SYSTEM AND METHOD FOR DISTRIBUTING COOLED AIR

[75] Inventors: Lennart Ståhl, Plano, Tex.; John Francis Wallace, Jr.; John Carlenas Parraz, both of San Ramon, Calif.; Montford Henry Clark, Basking Ridge, N.J.; David Winn, Lafayette, Calif.

[73] Assignees: Ericsson Inc., Research Triangle Park; AT&T, New York, both of N.Y.

[21] Appl. No.: 09/088,958

[22] Filed: Jun. 2, 1998

[51] Int. Cl.[7] .................................................. F28F 7/00
[52] U.S. Cl. ........................ 165/80.4; 165/104.34; 361/699; 257/714
[58] Field of Search .............................. 165/104.33, 80.4, 165/114.32, 104.34, 104.31, 185; 361/699; 257/714

[56] References Cited

U.S. PATENT DOCUMENTS

| | | | |
|---|---|---|---|
| 4,109,707 | 8/1978 | Wilson et al. | 165/80.4 X |
| 4,791,983 | 12/1988 | Nicol et al. | 165/80.4 |
| 4,865,123 | 9/1989 | Kawashima et al. | 165/104.33 |
| 5,150,274 | 9/1992 | Okada et al. | 165/80.4 X |
| 5,348,076 | 9/1994 | Asakawa | 165/104.33 X |
| 5,522,452 | 6/1996 | Mizuno et al. | 165/80.4 X |
| 5,815,370 | 9/1998 | Sutton | 165/80.4 X |

OTHER PUBLICATIONS

Stahl and Zirath, TELECOOL, a New Generation of Cooling Systems for Switching Equipment, Ericsson Review, vol. 4, 1992, pp. 124–132.

*Primary Examiner*—Christopher Atkinson
*Attorney, Agent, or Firm*—Jenkens & Gilchrist

[57] ABSTRACT

A cooling system employing redundant system components is disclosed. The system includes multiple sets of heat exchanger units, with each set being in fluid communication with a separate, independently operated fluid pump unit. The heat exchanger units are arranged in at least one row of heat exchanger units. The two sets of heat exchanger units are evenly interspersed with each other along the row of heat exchanger units so that a substantially uniform distribution of cooled air is provided in the event one fluid pump unit fails.

15 Claims, 4 Drawing Sheets

COOLING SYSTEM AND METHOD FOR DISTRIBUTING COOLED AIR

CROSS REFERENCE TO RELATED APPLICATIONS

This application is related to U.S. applications for patent, Ser. No. 09/088,755, filed Jun. 2, 1998, entitled "System, Method and Apparatus for Purging Fluid" (Docket No. 27943-231); Ser. No. 09/089,333, filed Jun. 2, 1998, entitled "Spray Hood Protector in a Fluid-based Cooling System" (Docket No. 27943-232); and Ser. No. 09/088,981, filed Jun. 2, 1998, entitled "Cooling System and Method for Separating Air Flows in a Cooling System" (Docket No. 27943-234).

BACKGROUND OF THE INVENTION

1. Technical Field of the Invention

The present invention relates to cooling systems for cooling electronic equipment, and particularly to cooling systems employing redundancy to maintain desired temperature conditions in the event of system component failure.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room.

One problem inherent with all electronic equipment., telecommunications or otherwise, is temperature control. As is readily apparent, if telecommunications switching equipment or other electronic components are not effectively cooled, the internal temperature of the electronic components substantially increase, thereby leading to significantly reduced system performance and, in some cases, total system failure.

Conventional approaches to cooling the aforementioned central control or other such apparatus/equipment rooms utilize directing air through coils having cooled liquid flowing therethrough. The air is cooled as it passes the cooled coils. By directing the resulting cooled air towards the equipment to be cooled, the internal temperature of the equipment is reduced, thereby allowing the equipment to operate more efficiently and with reduced risk of system shutdown.

The performance and reliability of electronic equipment, such as telecommunication switching systems, are thus directly tied to the ability of the corresponding cooling systems to maintain equipment operating temperatures at or below desired temperature levels. If the cooling system cannot reliably and continuously cool the equipment due to failure of one or more cooling system components, such as cooling system pump units, system failure results. There is a need, therefore, for cooling systems to substantially continuously maintain equipment operating temperatures within prescribed limits, even in the event of failure of one or more cooling system components.

It is an object of the present invention to provide a cooling system for effectively cooling electronic equipment.

Another object of the invention is to provide a cooling system which provides a sufficient supply of cooled air even during periods of component malfunction.

It is also an object of the present invention to provide such a system which employs system component redundancy.

SUMMARY OF THE INVENTION

The present invention overcomes the shortcomings of prior equipment cooling systems and satisfies a significant need for a robust cooling system which maintains sufficient equipment operating temperatures. The present cooling system utilizes redundancy of some of its key components in order to ensure equipment operating temperatures are maintained.

According to the present invention, there is provided a cooling system employing multiple sets of heat exchanger units. Each set of heat exchanger units is connected to a separate fluid pump unit, so that cooled fluid is pumped into the different sets of heat exchanger units independently of each other. The heat exchanger units, such as cooling coils, are preferably arranged in at least one row in which heat exchanger units from each set of heat exchanger units are evenly spread out along the row. For example, adjacent heat exchanger units in the row may be associated with different fluid pump units. In this way, if one fluid pump unit malfunctions, the remaining operational fluid pump units may continue to provide cooled fluid to their corresponding heat exchanger units. Because the heat exchanger units associated with the operational fluid pump units are evenly interspersed with the heat exchanger units associated with the malfunctioning fluid pump unit along the row of heat exchanger units, the cooling system is capable of providing a sufficient distribution of cooled air to the equipment.

BRIEF DESCRIPTION OF THE DRAWINGS

A more complete understanding of the system and method of the present invention may be had by reference to the following detailed description when taken in conjunction with the accompanying drawings wherein.

DETAILED DESCRIPTION OF THE PRESENTLY PREFERRED EXEMPLARY EMBODIMENTS

The present invention will now be described more fully hereinafter with reference to the accompanying drawings in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
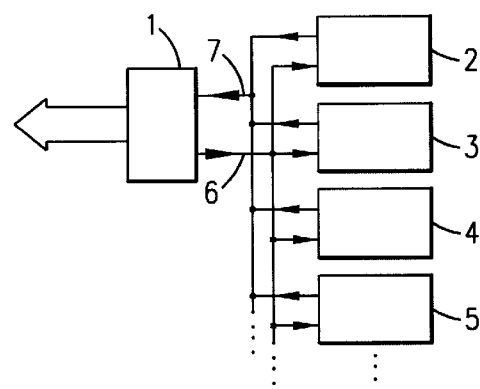
FIG. 1 illustrates a conventional cooling system for electronic equipment.

Referring to FIG. 1, there is shown a conventional cooling system in which pump 1 supplies a liquid to heat exchanger units and/or cooling coils 2–5 via a supply line 6 and receives the return liquid via a return line 7. Cooling coils 2–5 are arranged in a row of cooling coils. Pump 1 preferably pumps a cooled liquid into supply line 6 for distributing into cooling coils 2–5. Cooling coils 2–5 are cooled as the cooled liquid flows therethrough. Air directed in relatively close proximity to the cooling coils 2–5 is thereafter cooled. The cooled air then may be redirected towards electronic equipment in order to reduce the operating temperature thereof.

A significant problem exists, however, if pump 1 or any other vital component of the conventional cooling system malfunctions. In this case, with pump 1 being unable to distribute cooled liquid to cooling coils 2–5, cooling coils 2–5 are not cooled. Consequently, air passing in close proximity to cooling coils 2–5 is not cooled, thus resulting in the conventional cooling system being unable to sufficiently cool the electronic equipment.

Figure 2:
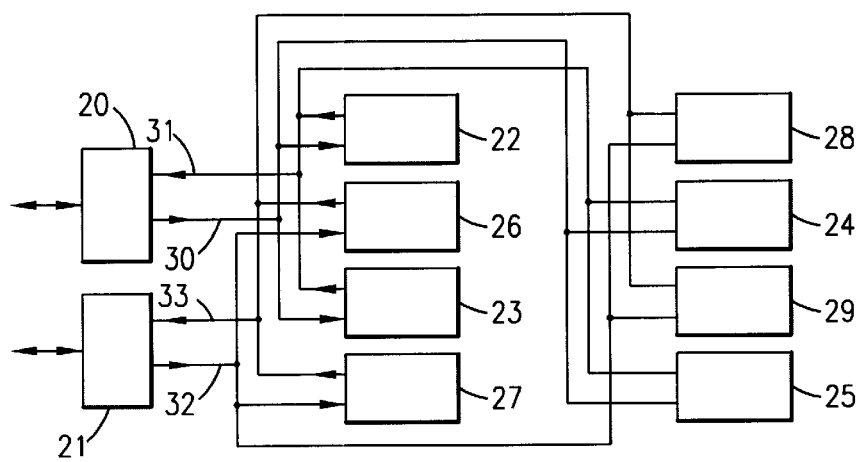
FIG. 2 illustrates a cooling system according to a preferred embodiment of the present invention.

With reference to FIG. 2, however, there is shown an improved cooling system according to the present invention which overcomes this dire limitation. The present cooling system utilizes at least two pump units 20 and 21, which are in fluid communication with heat exchanger units and/or cooling coils 22–25 and 26–29, respectively. Specifically, pump unit 20 distributes cooled fluid to cooling coils 22–25 a via supply line 30 and receives return fluid therefrom via a return line 31. Pump unit 21, on the other hand, provides cooled fluid to cooling coils 26–29 via a supply line 32 and receives the return fluid therefrom via a return line 33. Pump units 20 and 21 preferably operate independently of each other so that in the event one pump unit malfunctions and is unable to provide cooled fluid to its corresponding cooling coils, the operational pump unit is still capable of continuously supplying cooled fluid to the cooling coils to which it is connected.

Figure 3:
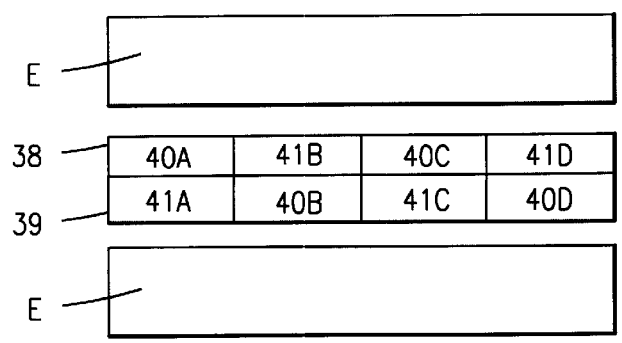
FIG. 3 is a top plan view of the cooling system of FIG. 2.
Figure 4:
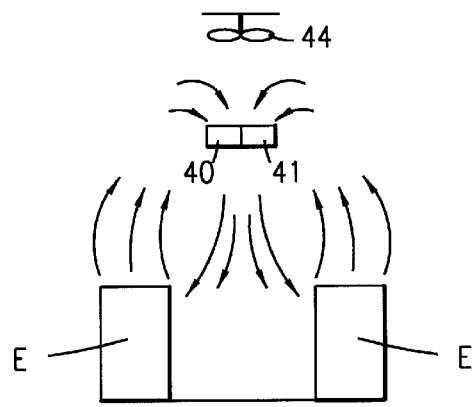
FIG. 4 is a side elevational view of the cooling system of FIG. 2.

In a preferred embodiment of the present invention, cooling coils 22–29 are preferably arranged in one or more rows of cooling coils, e.g., rows 38 and 39, so that the rows of coils may be disposed between and/or in close proximity to electronic equipment E, as shown in FIGS. 3 and 4. The configurations set forth in the present invention are advantageous for overhead, fluid-based cooling systems cooling the electronic equipment E therebelow. The particular cooling coils are arranged along the row of cooling coils 38 and 39 such that cooling coils associated with pump unit 20 and cooling coils associated with pump unit 21 are substantially evenly disposed along the row of cooling coils. FIG. 3 illustrates a preferred staggered relationship between the various cooling coils associated with different pump units. For reasons of clarity, the cooling coils in fluid communication with pump unit 20 are identified in FIG. 3 as cooling coils 40, and the cooling coils in fluid communication with pump unit 21 are identified as cooling coils 41. As can been seen in FIG. 3, the cooling coils which are connected to pump units 20 and 21 are arranged in alternating succession along each row 38 and 39 of cooling coils. As is apparent from the figure, immediately adjacent cooling coils within the row of cooling coils receive cooled fluid from different pump units, e.g., cooling coil 41B is flanked by cooling coils 40A and 40C. In addition, cooling coils from different rows of cooling coils which are immediately adjacent each other are connected to different pump units, e.g., the aforementioned cooling coil 41B is also flanked by cooling coils 40B in the adjacent row 39. As a result, in the event one of pump units 20 and 21 malfunctions, the remaining operational pump unit is capable of providing a sufficient level and distribution of cooled air to equipment E due to the substantially uniform positioning of the operational cooling coils along the rows 38 and 39 of cooling coils.

FIG. 4 illustrates the aforementioned overhead, fluid-based cooling system implementation of the present invention. In this implementation, the cooling system utilizes the properties of natural convection, by which ambient air heated by equipment E flows upwardly and is then directed downwardly through suspended cooling coils 40, 41 towards equipment E. It is understood, however, that the present invention may be suitably associated with any of a number of different apparatuses or methods for drawing heated air from the electronic equipment, directing the air in close proximity to the cooling coils and redirecting the cooled air towards equipment E. For instance, a fan 44 (FIG. 4) may be employed to direct air through the cooling coils and towards equipment E. Further, cooling coils of the present invention need not be suspended above equipment E and may be instead positioned along the side of equipment E or beneath the flooring upon which equipment E rests.

Figure 5:
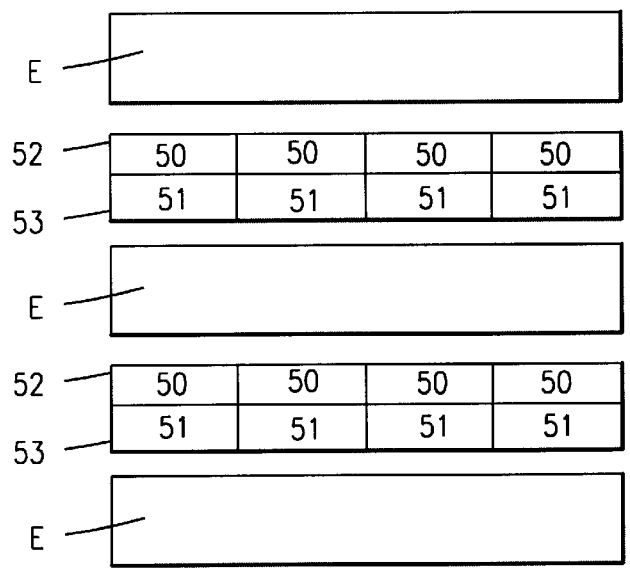
FIG. 5 illustrates a top plan view of a second configuration of the cooling system according to a preferred embodiment of the present invention illustrated in FIG. 2.

Referring to FIG. 5, there is shown a second configuration of the cooling coils of the present invention illustrated in FIG. 2. The cooling coils in fluid communication with pump unit 20 are identified as cooling coils 50, and the cooling coils in fluid communication with pump unit 21 are identified as cooling coils 51. As can be seen, each cooling coil in cooling coil row 52 is connected to pump unit 20, and each cooling coil in cooling coil row 53 is connected to pump unit 21. Although a single pump unit provides cooled fluid to each cooling coil in a row of coils, this configuration of cooling coils is nonetheless capable of providing an even distribution of cooled air to equipment E in the event either pump unit 20 or pump unit 21 malfunctions, because adjacent cooling coils in different rows of coils are supplied by different pump units.

Figure 6:
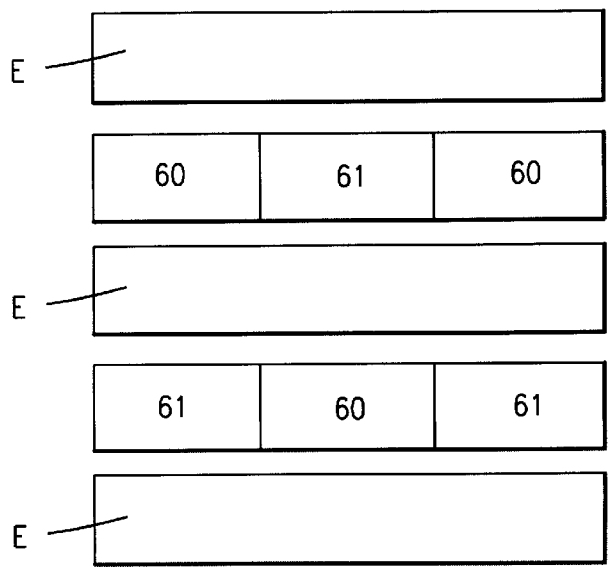
FIG. 6 illustrates a top plan view of a third configuration of the cooling system according to a preferred embodiment of the present invention illustrated in FIG. 2.

As illustrated in FIG. 5, pairs or groups of rows of cooling coils may be spaced apart from each other so that a row of equipment E may be disposed between two groups of rows of cooling coils. The cooling coils of the present invention may also be arranged in rows of cooling coils wherein individual rows of cooling coils are spaced apart from each other so that equipment E may disposed therebetween. Referring now to FIG. 6, the cooling coils connected to pump unit 20 are identified as cooling coils 60 and cooling coils connected to pump unit 21 are identified as cooling coils 61. As can be seen, cooling coils 60 and 61 are arranged in alternating succession along each row, with the cooling unit at the beginning of each row being different among the adjacent, spaced rows. In this way, the present cooling system is capable of providing an even distribution of cooled air to each row of equipment E in the event one of pump unit 20, 21 is rendered inoperable.

Figure 7:
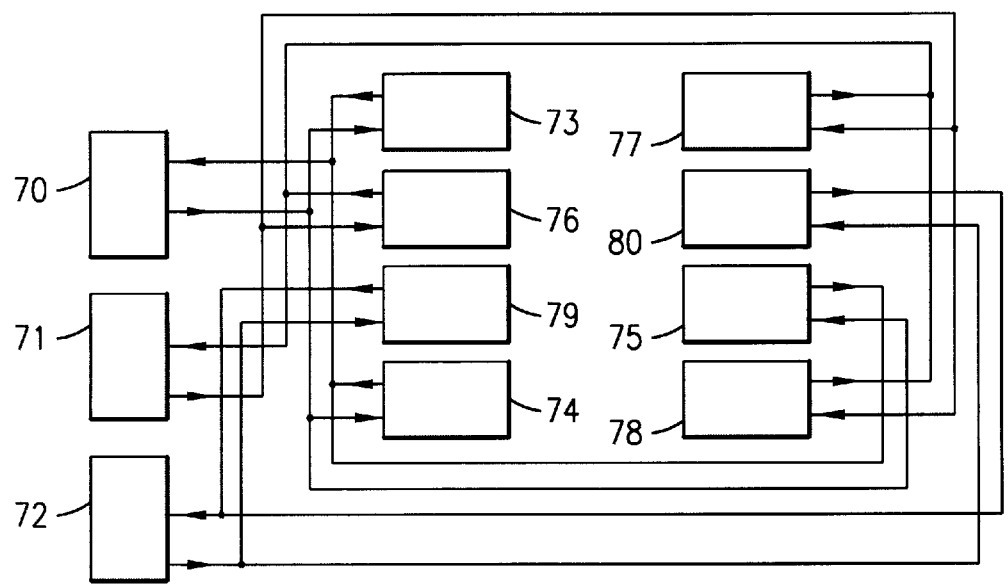
FIG. 7 illustrates a cooling system according to a second preferred embodiment of the present invention.
Figure 8:
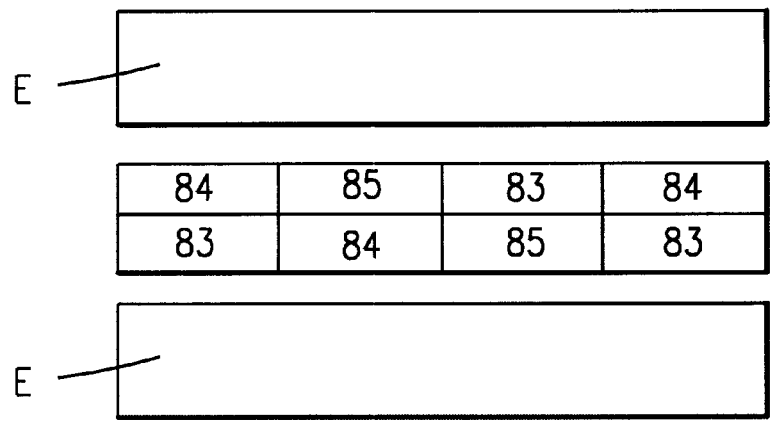
FIG. 8 illustrates a top plan view of the cooling system according to the preferred embodiment of the present invention illustrated in FIG. 7.

The present cooling system may include additional redundant components in order to ensure that a sufficient amount of cooled air is provided to equipment E. In a second preferred embodiment of the present invention, illustrated in FIG. 7, three pump units 70–72 pump cooled fluid through a number of cooling coils 73–80. Pump unit 70 provides cooled fluid to cooling coils 73–75, pump unit 71 provides cooled fluid to cooling coils 76–78, and pump unit 72 provides cooled fluid to cooling coils 79–80. Cooling coils 73–80 may be arranged in two adjacent rows of cooling coils, as indicated in FIG. 7 and more clearly shown in FIG. 8. In order to ensure that a substantially uniform distribution of cooled air is directed to equipment E along the entire row of cooling coils when a pump unit malfunctions, cooling coils associated with each pump unit 70–72 are substantially evenly disposed along the row or rows of cooling coils. For instance, adjacent cooling coils in a row of cooling coils may be connected to different pump units. This is best seen in FIG. 8, wherein the cooling coils associated with pump unit 70 are identified as cooling coils 83, the cooling coils associated with pump unit 71 are identified as cooling coils 84, and the cooling coils associated with pump unit 72 are identified as cooling coils 85. Further, cooling coils from different rows of coils that are immediately adjacent each other are connected to different pump units. By staggering or interspersing the cooling coils associated with one pump unit with cooling coils associated with the other pump units along the rows of cooling coils, an appreciable level of distribution of cooled air can be provided substantially along the entire row of cooling coils even if one or two pump units is inoperable.

Figure 9:
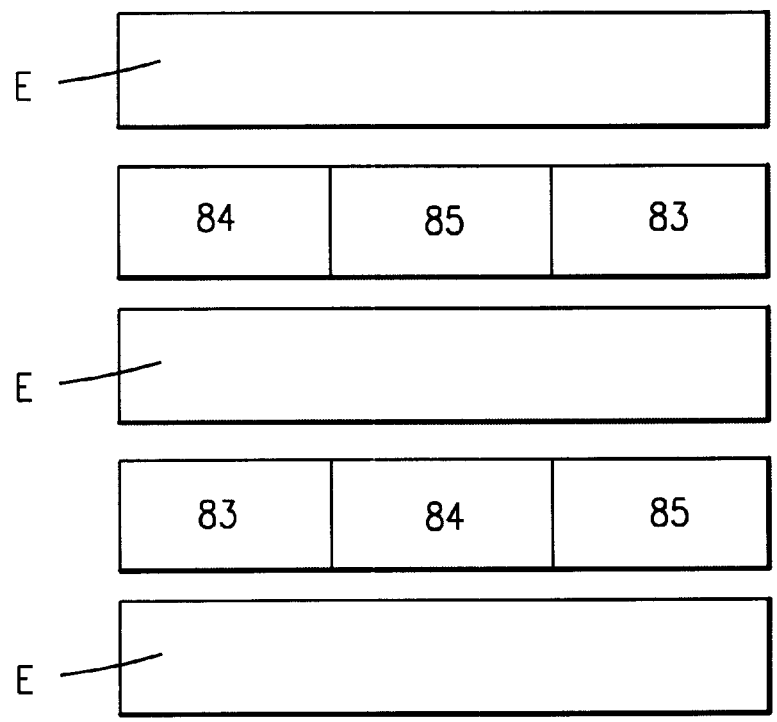
FIG. 9 illustrates a top plan view of a second configuration of the cooling system according to a preferred embodiment of the present invention illustrated in FIG. 7.

It is understood that the rows of cooling coils may be spaced apart from each other so that a row of equipment E may be disposed therebetween, as shown in FIG. 9. It is further noted that a pump unit may be in fluid communication with any number of cooling coils so long as a sufficient level of distribution of cooled air is provided in the event one pump unit fails.

Although the preferred embodiments of the system and method of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A cooling system for cooling at least one heat generating object, said cooling system comprising:

a first and a second heat exchanger; and a first and a second pump for pumping fluid through said first and said second heat exchangers, respectively, said first and said second heat exchangers being disposed adjacent one another along a row;

said first and said second heat exchangers respectively comprise a plurality of first and second heat exchanger units, said first and said second exchanger units being alternatively disposed along said row, whereby heat exchanger units associated with one of said first and said second pumps are separated from each other by heat exchanger units associated with another one of said first and said second pumps.

2. The cooling system according to claim 1, wherein said first and said second heat exchanger units are alternatively disposed along a first and a second row, said first and said second rows being adjacent one another.

3. The cooling system according to claim 2, wherein said alternatingly disposed heat exchanger units in said first row are alternatingly disposed to said heat exchanger units in said second row.

4. The cooling system according to claim 1, wherein said first and said second heat exchanger units are alternatingly disposed along a plurality of adjacent rows.

5. The cooling system according to claim 1, further comprising a plurality of rows of said heat exchangers, at least one of said rows being displaced from another row.

6. The cooling system according to claim 1, further comprising:

a device for circulating air in proximity to said first and said second heat exchanger units.

7. An apparatus for controlling the temperature of air surrounding an object, comprising:

a first pump unit;

a second pump unit; and a plurality of heat exchanger units, each of said heat exchanger units being in fluid communication with one of said first pump unit and said second pump unit, said heat exchanger units being arranged in a row of heat exchanger units, said heat exchanger units comprise a plurality of first heat exchanger units and a plurality of second heat exchanger units, each said first heat exchanger unit is in fluid communication with said first pump unit and each said second heat exchanger unit is in fluid communication with said second pump unit, and said first heat exchanger units and said second heat exchanger units are arranged in alternating succession alone said row of heat exchanger units.

8. The apparatus of claim 7, wherein said heat exchanger units in fluid communication with said first pump unit and said heat exchanger units in fluid communication with said second pump unit are substantially evenly disposed along said row of heat exchanger units.

9. The apparatus of claim 7, wherein:

said heat exchanger units are arranged in a plurality of rows of heat exchanger units; and said first pump unit is in fluid communication with at least one said first heat exchanger unit in each said row of heat exchanger units, and said second pump unit is in fluid communication with at least one said second heat exchanger unit in each said row of heat exchanger units.

10. The apparatus of claim 9, wherein each heat exchanger unit which is adjacent a heat exchanger unit from another of said rows of said heat exchanger units is in fluid communication with a pumping unit which is different from a pumping unit that is in fluid communication with said adjacent heat exchanger unit in said another of said rows.

11. The apparatus of claim 9, wherein said first heat exchanger units and said second heat exchanger units are substantially evenly disposed along each said row of heat exchanger units.

12. A method for cooling heat generating objects, comprising the steps of:

obtaining a plurality of first and second cooling coils;

arranging said first and said second cooling coils in at least one row of cooling coils, said first cooling coils being interspersed between said second cooling coils along said at least one row of cooling coils;

passing fluid through said first cooling coils;

passing fluid through said second cooling coils independently of said step of passing fluid through said first cooling coils;

directing air in close proximity to said row of cooling coils; and redirecting said directed air towards said heat generating objects.

13. The method of claim 12, wherein said at least one row of cooling coils is arranged in said arranging step such that each said first cooling coil is immediately adjacent a second cooling coil.

14. The method of claim 12, wherein said step of arranging includes arranging said first cooling coils and said second cooling coils in a plurality of rows of cooling coils, wherein said first cooling coils are substantially evenly interspersed with said second cooling coils along each said row of cooling coils.

15. The apparatus of claim 11, further comprising:

a fan for directing airflow in proximity to said row of heat exchanger units.

* * * * *

UNITED STATES PATENT AND TRADEMARK OFFICE
CERTIFICATE OF CORRECTION

PATENT NO. : 6,161,612
DATED : December 19, 2000
INVENTOR(S) : Lennart Stahl et al.

It is certified that error appears in the above-identified patent and that said Letters Patent is hereby corrected as shown below:

<u>Title page,</u>
Item [75], delete "Carlenas" replace with -- Cardenas --

<u>Column 6,</u>
Line 11, delete "alone" replace with -- along --
Line 63, delete "claim 11" replace with -- claim 7 --

Signed and Sealed this

Fifteenth Day of January, 2002

Attest:

JAMES E. ROGAN
*Director of the United States Patent and Trademark Office*

*Attesting Officer*